United States Patent [19]

Agoston et al.

[11] Patent Number: 4,755,742

[45] Date of Patent: Jul. 5, 1988

[54] DUAL CHANNEL TIME DOMAIN REFLECTOMETER

[75] Inventors: Agoston Agoston, Beaverton; John B. Rettig, Aloha; Stanley P. Kaveckis, Aurora; John E. Carlson, Portland; Andrew E. Finkbeiner, Beaverton, all of Oreg.

[73] Assignee: Tektronix, Inc., Beaverton, Oreg.

[21] Appl. No.: 858,611

[22] Filed: Apr. 30, 1986

[51] Int. Cl.$^4$ .................. H03K 17/16; H03K 17/74
[52] U.S. Cl. .................. 324/58 B; 307/352; 307/353; 333/26; 328/151
[58] Field of Search .................. 333/25, 26; 307/352, 307/353; 328/151; 324/58, 58.5, 84, 77 G, 77 H, 533, 534

[56] References Cited

U.S. PATENT DOCUMENTS

| 3,715,667 | 2/1973 | Nicolson | 324/58.5 B |
|---|---|---|---|
| 3,721,912 | 3/1973 | Ross | 333/26 |
| 3,771,056 | 11/1973 | Zimmerman | 324/58 B |
| 3,851,260 | 11/1974 | Colin | 307/353 |
| 4,287,441 | 9/1981 | Smith | 324/58.5 B |
| 4,359,690 | 11/1982 | Tucker | 307/353 |
| 4,647,795 | 3/1987 | Agoston | 307/353 |
| 4,654,600 | 3/1987 | Lockwood | 328/151 |
| 4,659,945 | 4/1987 | Metz | 307/353 |
| 4,659,946 | 4/1987 | Agoston | 307/353 |

Primary Examiner—Reinhard J. Eisenzopf
Assistant Examiner—Jose M. Solis
Attorney, Agent, or Firm—William O. Geny; Robert S. Hulse

[57] ABSTRACT

A dual channel time domain reflectometer includes a pair of input lines connected at respective nodes to a reference flat current pulse generator and a traveling wave sampling gate, respectively. The sampling gates are actuated by a balanced strobe generator which includes a waveguide coupler for coupling a high amplitude fast rise time pulse to each of the gates simultaneously. Pulses of requisite amplitude and shape are generated by a circuit responsive to a strobe trigger input which drives a step recovery diode.

21 Claims, 3 Drawing Sheets

DUAL CHANNEL TIME DOMAIN REFLECTOMETER

BACKGROUND OF THE INVENTION

The following invention relates to a dual channel time domain reflectometer in which two data channels may be synchronously sampled with an extremely high degree of data resolution and accuracy.

Time domain reflectometers (TDR's) are used to measure impedance anomalies in cables and other devices under test. Typcially, a time domain reflectometer comprises a current pulse source which is connected to a cable under test or a cable leading to a device uner test. Another point on the cable is connected to an oscilloscope. The current source provides a pulse to the cable/device under test and any impedance discontinuities or mismatches may be viewed as reflections of the current pulse on an oscilloscope. An example of such a system is shown in Frye, U.S. Pat. No. 3,434,049.

Advances in semiconductor chip technology have created a need for measuring and analyzing integrated circuit devices which respond very quickly and with minimal distortion to input waveforms. Such devices are difficult to test, however, because of the inherent data resolution limitations in the current generation of test equipment. For example, it would frequently be advantageous to know the propagation time of a pulse through an integrated circuit, and also the shape of the output wafeform as a function of a test input. These measurements are now possible in a single channel time domain reflectometer, which can only measure a reflection of an input pulse at either the input or the output of a device. It is possible to tie together two identical time domain reflectometers in order to make differential measurements, or to measure both the reflection of a test pulse at the input of a device under test and the resulting output pulse. But, while in theory such an arrangement can be constructed, as a practical matter it would have little utility due to timing errors which would make it impossible to sample both the input and output of a device under test at the same time. In order to sample and analyze differential inputs or both a reflected input pulse and the resulting output pulse from a device under test, it is necessary to have extremely accurate timing resolution. Moreover, it is necessary to ensure that the test pulse is isolated from the sampling circuit so that internal reflections of the test pulse do not degrade the input waveforms.

In prior art devices such as that shown in FIG. 1, a current pulse generator 1 is connected to a sampling head 2 by means of a transmission line 3. The sampling head 2 is then connected to a device under test (DUT) 4. At the interface between the transmission line 3 leading from the current pulse generator 1 to the sampling head 2, however, multiple reflections of a test pulse could occur which effectively degrade the wave shape of any input pulse to be sampled by the sampling head 2. Moreover, with this type of arrangement, a dual channel TDR having the necessary timing resolution would be difficult to construct because of ambiguities in the timing of pulses transmitted over the internal transmission line.

SUMMARY OF THE INVENTION

The dual channel time domain reflectometer of the present invention comprises pair of input channels in which each of the input channels includes an internal input line. A reference flat pulse current generator for generating test pulses is coupled to each channel along with a travelling wave sampling gate for sampling the reflections of the test pulses in each of the channels. Each input line, together with its respective pulse generator and sampling gate, is connected at a node so that the test pulses are generated at the same internal location at which the reflections of the test pulses are sampled. This avoids multiple internal refelctions such as those caused by transmission lines, which, in the prior art, had been used to link the sampling head with the current test pulse generator.

In order to precisely control the sampling of the reflected test pulse (or of a test pulse propagated through a device under test) on both channels, a balanced strobe generator is connected to each sampling gate so as to simultaneously actuate both sampling gates. Simultaneous actuation is provided by a waveguide coupler which provides actuating pulses in response to a pulse from a driver circuit. The waveguide coupler includes a ground plane conductor having two slots disposed at right angles to one another. A signal-carrying conductor is disposed within one of the slots to form a coplanar waveguide. The signal-carrying conductor is connected to the driver circuit and each of the other slots are connected to the sampling gates in each respective channel. The slots function as slot lines which are inductively coupled to the coplanar waveguide. When a pulse is generated by the driver circuit, it travels down the coplanar waveguide to a terminating resistance. This pulse induces a pair of sampling control pulses which are opposite in phase but equal in amplitude in each of the slot lines, which are disposed orthogonally with respect to the coplanar waveguide. These balanced pairs of pulses for each channel arrive at both sampling gates at the same time so that data on both channels is sampled simultaneously.

In order to use the waveguide coupler referred to above, it is necessary to generate a high amplitude pulse having a very fast rise time. This is accomplished through the use of a step recovery diode driver circuit. A step recovery diode is connected between the ground plane and the signal line of the coplanar waveguide. Connected by an inductive bond wire connection to the cathode of the step recovery diode is a driver circuit including an electronic switch pair in which one of the electronic switches is pre-biased to provide extremely fast switching for the other electronic switch. This circuit is responsive to short, low amplitude trigger pulses provided by a strobe pulse generator, and provides pulses to the signal-carrying line of the coplanar waveguide having extremely fast rise times and high amplitude sufficient to generate the matched pair of sampling control pulses.

Due to the presence of the waveguide coupler, the two channels are located adjacent one another at the front panel of the dual channel time domain reflectometer. Each input channel includes a signal line which is surrounded by a ground conductor and separated from the signal line by air. A connection node exists at opposite ends of the slot lines in the waveguide coupler where the sampling gates for each channel are located. At these node locations the coaxial ground is cut away from the signal line and a bond wire connection is made from the sampling head circuuiry to the signal line. On the opposite side of the input line in each channel, a flat pulse current generator circuit is located which is also connected to each respective node. Thus, the test pulses are generated in each respective channel and sampled at the same electrical and physical location. This insures that sampling occurs in both channels simultaneously, thereby providing a high degree of timing resolution with no internal degradation of the signal due to multiple internal reflections along connecting cables.

It is a principal object of this invention to provide a dual channel time domain reflectometer having a very high degree of timing resolution and measurement accuracy.

Yet a further object of this invention is to reduce distortion of both test and data signals in a dual channel time domain reflectometer by providing an input connection configuration in which each channel includes a common connection node to an input line for a traveling wave sampling gate and a reference flat pulse current generator.

A still further object of this invention is to provide a waveguide coupler for providing actuating pulses to both channels of a dual channel TDR so as to sample data on each channel simultaneously.

Yet a further object of this invention is to provide a driver circuit responsive to a strobe pulse generator for producig a fast rise time, high amplitude pulse for generating sampling control pulses in a waveguide coupler so that both channels may be sampled simultaneously.

The foregoing and other objectives, features and advantages of the present invention will be more readily understood upon consideration of the following detailed description of the invention taken in conjunction with the accompanying drawings.

DETAILED DESCRIPTION OF THE INVENTION

Figure 1:
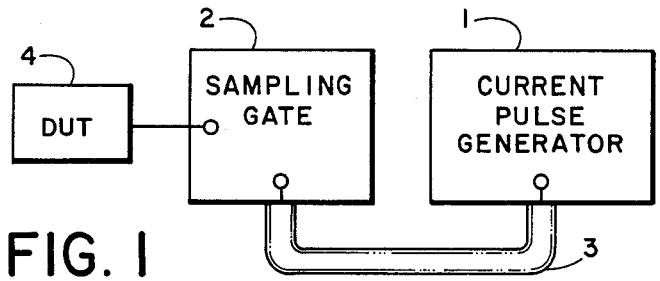
FIG. 1 is a block schematic diagram of a prior art single-channel time domain reflectometer.
Figure 2:
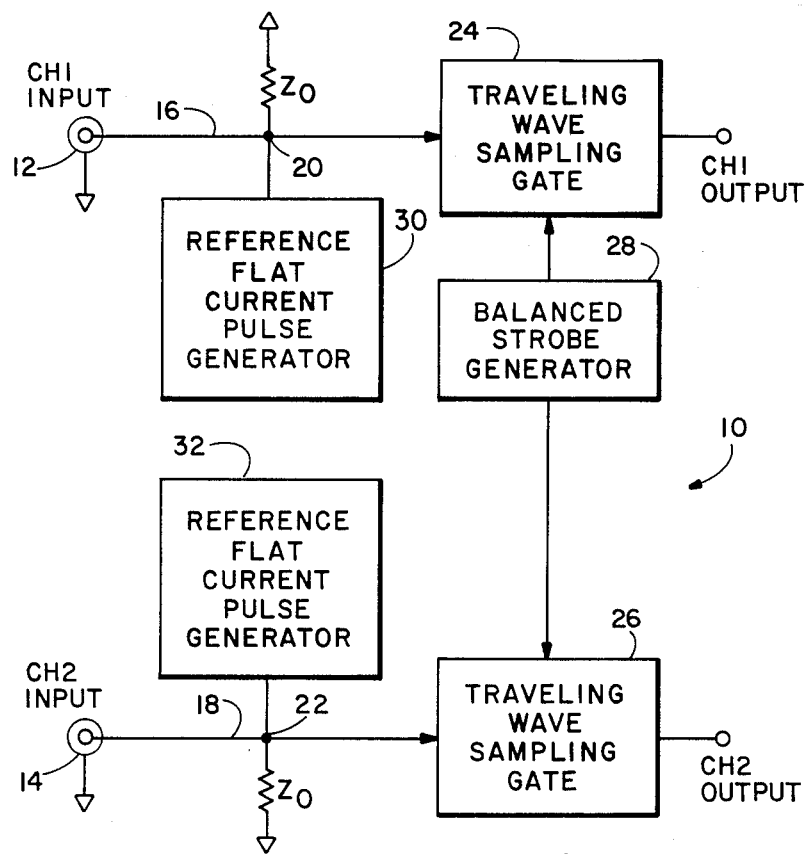
FIG. 2 is a block schematic diagram of a dual channel time domain reflectometer of the present invention.

Referring to FIG. 2, a dual channel time domain reflectometer (TDR) 10 includes a first input channel 12 and a second input channel 14. Internal input lines 16 and 18 are connected to nodes 20 and 22, respectively. A terminating impedance $Z_O$ is connected to each of the nodes 20 and 22 by way of a transmission line (not shown in FIG. 2). Connected to nodes 20 and 22 are a pair of traveling wave sampling gates 24 and 26. The sampling gates 24 and 26 are driven by a balanced strobe generator 28. Also connected to nodes 20 and 22 are a pair of reference flat current pulse generators 30 and 32, respectively.

Figure 3:
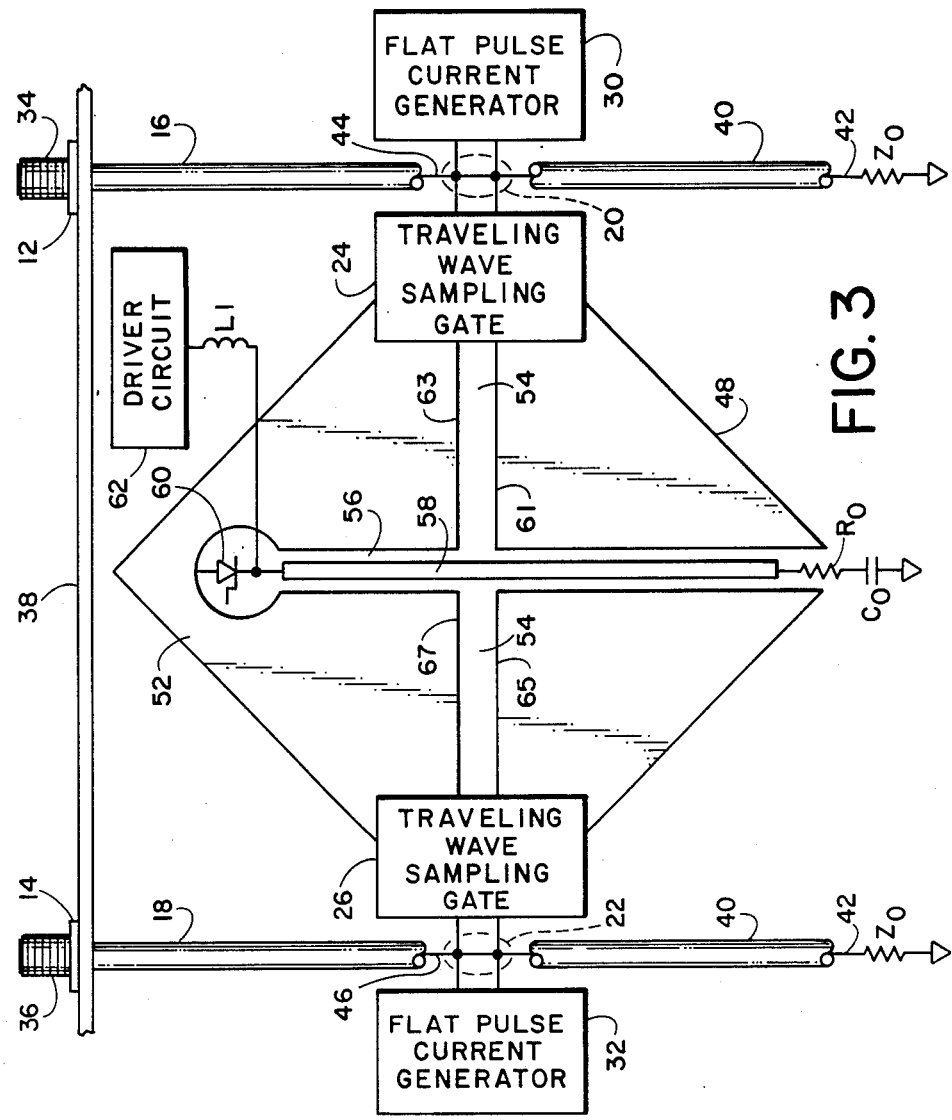
FIG. 3 is a schematic diagram including details of the mechanical layout of the electrical connections in the diagram of FIG. 2 including a waveguide coupler for coupling the output of a driver circuit to each of the input channels of the dual channel time domain relfectometer of FIG. 2.

The physical layout of the block diagram of FIG. 2 within the chassis of the dual channel TDR 10 is shown in FIG. 3. Channel inputs 12 and 14 include a pair of input jacks 34 and 36, respectively, located on the outside of a chassis panel 38. Behind the chassis panel 38 and connected to jacks 34 and 36 are internal input lines 16 and 18, respectively. The internal input lines 16 and 18 are transmission lines which include an outer coaxial sheath 40 surrounding a signal-carrying line 42. Both internal input lines 16 and 18 include cutaway portions 44 and 46, respectively, where the coaxial shielding 40 is stripped away from the signal-carrying conductor 42. This is to expose a portion of each signal-carrying line 42 so that it can be connected at nodes 20 and 22, respectively (indicated by the dotted outlines), to the respective traveling wave sampling gate and reference flat current pulse generator for each channel. On internal input line 16 reference flat pulse generator 30 is connected to node 20 as is traveling wave sampling gate 24. At node 22, the internal input line 18 is connected to traveling wave sampling gate 26 and reference flat pulse generator 32. This arrangement places both nodes 20 and 22 just behind front panel jacks 34 and 36 adjacent one another. This physical layout helps to provide precise synchronization in the sampling of signals on internal input lines 16 and 18, and minimizes signal degradation internally of chassis panel 38 due to the effects of stray capacitance. Two connections at both nodes 20 and 22 are shown for connecting travelling wave sampling gates 24 and 26 and reference flat current pulse generators 30 and 32 to their respective nodes. The reason for this type of connection is due to the use of a diode bridge at the point of connection, an example of which may be found in co-pending patent application Ser. No. 845,900 now U.S. Pat. No. 4,647,795 entitled "Travelling Wave Sampler" and assigned to the same assignee. Similarly, a suitable reference flat current pulse generator of a type suitable for use in the present invention may be found in co-pending patent application Ser. No. 845,289 entitled "Fast Transition Flat Pulse Generator" and assigned to the same assignee.

In order to assure that signals on input lines 16 and 18 are sampled synchronously, a waveguide coupler indicated generally at 48 is provided to couple a trigger pulse from a strobe pulse generator (not shown) to traveling wave sampling gates 24 and 26, respectively. The waveguide coupler 48 includes a diamond-shaped ground plane 52 including orthogonally disposed slots 54 and 56. (The shape of the ground plane 52 is not material to the purposes of the invention, and other considerations may dictate the most convenient shape.) Slot 56 includes a signal carrying line 58 which begins at step recovery diode 60 and terminates at a resistor $R_O$. The cathode of the step recovery diode 60 is connected to signal-carrying line 58 while its anode is connected to the ground plane 52. A driver circuit 62 is also connected to the cathode of step recovery diode 60 through inductor L1. The timing of a strobe trigger pulse applied to traveling wave sampling gates 24 and 26 is controlled by the balanced strobe generator 28 (FIG. 2) which may, in turn, be under the control of a computer or other microprocessor-based system (not shown). Each traveling wave sampling gate 24, 26 is actuated only upon receipt of a pair of relatively high amplitude, fast rise time, exponential pulses. It is important for the proper functioning of the dual channel TDR 10 that samples of signals on internal input lines 16 and 18 are taken at precisely the same time. It is the purpose of the driver circuit 62, its associated inductor L1, and step recovery diode 60 to provide a single-ended high amplitude pulse having a fast rise time, that is, one between 70–100 picoseconds. The waveguide coupler 48 transforms the single-ended pulse into a pair of sampling control pulses which are applied to each of the traveling wave sampling gates 24 and 26. Since the geometry of the wave guide coupler 48 is symmetrical, these pulses will arrive at precisely the same time at each gate 24, 26.

The signal-carrying conductor 58 disposed within slot 56 and surrounded by ground plane 52 functions as a coplanar waveguide. Slot 54 functions in this configuration as a slotline waveguide having two branches, one terminating at sampling gate 24 and the other terminating at sampling gate 26. When a driving pulse from the step recovery diode 60 is generated on conductor 58, a pair of pulses are induced in each of the branches of slot 54. In accordance with the characteristic behavior of slotline waveguides, a positive pulse is created which travels near the inner edges 61, and 65 of slot line 54. Within the same ground plane and on the inner edges 63 and 67, there is generated a negative going pulse which is symmetrical with the positive going pulse generated along the edges 61 and 65. These pulses are generated inductively by the driving pulse traveling along conductor 58. Thus, the intersection of signal-carrying line 58 and slotline 54 functions in a manner similar to a very high efficiency transformer in which a single-ended driving pulse is transformed into pairs of oppositely phased but time coherent pulses which are then supplied to the traveling wave sampling gates 24 and 26 to synchronously actuate these gates.

When the traveling wave sampling gates 24 and 26 are turned off, test pulses may be transmitted to a device under test (not shown) which may be connected to input jacks 34 and 36. These test pulses are generated by flat pulse current generators 30 and 32. Since generators 30 and 32 are connected directly to the respective nodes 20 and 22 without an intervening coaxial cable or connectors, degradation of the wave shape of the generators 30 and 32 is minimized. Furthermore, the flat current pulse generators 30 and 32 are oriented across from each of the traveling wave sampling gates 24 and 26 on opposite sides of internal input lines 16 and 18, respectively. This orientation minimizes any capacitive reactance that might otherwise be caused by orienting the input lines for the pulse generators 20 and 32 at other than right angles to respective internal input lines 16 and 18.

Figure 4:
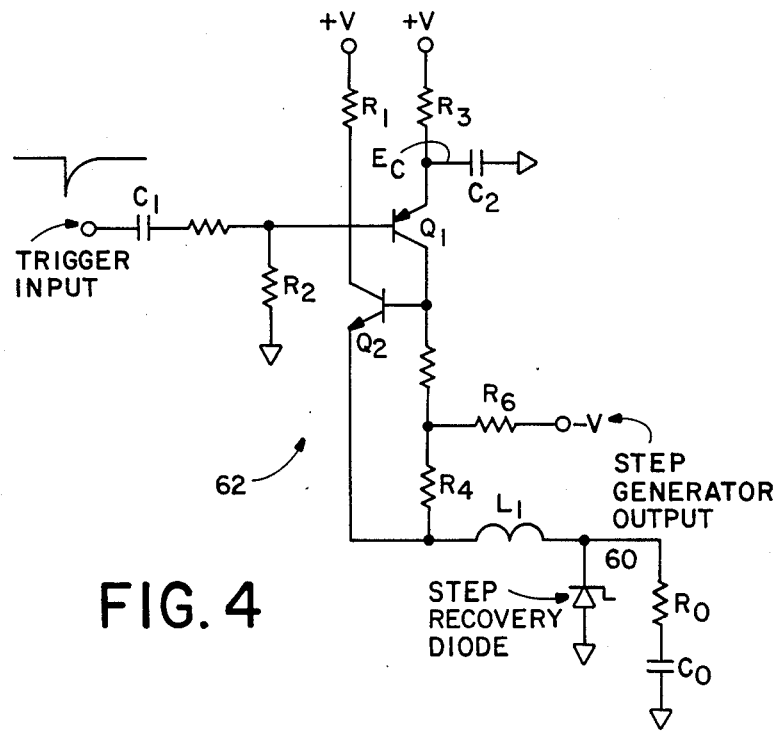
FIG. 4 is a schematic circuit diagram of a step recovery diode driver circuit which is part of the balanced strobe generator of FIG. 2.

In order to utilize the advantages of the traveling wave sampling gates 24 and 26 as disclosed in the aforementioned U.S. Pat. No. 4,647,795, it is necessary to generate a high amplitude voltage pulse having an extremely fast rise time. This capability is provided by the circuit in FIG. 4 which includes drive circuit 62, inductor L1 and step recovery diode 60. A strobe pulse generator (not shown) provides driver circuit 62 with a strobe trigger input applied to coupling capacitor C1. Electronic switches comprising transistors Q1 and Q2 function like a thyristor in which Q1 is permanently biased in an "on" state by a voltage divider comprising R1 and R2. A voltage Ec is stored in capacitor C2 through resistor R3. Resistors R6 and R4 provide a path for negative voltage $-V$ to bias the step recovery diode 60 through inductor L1. Q1 is on permanently because of the voltage divider formed by R1 and R2, which in turn provides a bias signal to the base of Q2. When Q1 receives a negative pulse through C1, it develops a high voltage at the base of Q2 which turns Q2 on. Since Q2 is pre-biased, the switching action is very fast. When Q2 turns on it increases the base current of Q1, which in turn increases the voltage level at the base of Q2. This creates a cascading effect which quickly drives both transistors Q1 and Q2 into saturation and allows the voltage Ec which is stored in C2 to flow through inductor L1. Inductor L1 is, in the preferred embodiment, a bond wire connection between the cathode of step recovery diode 60 and driver circuit 62. The extremely fast switching action of transistors Q1 and Q2 provides a high amplitude voltage Ec to step recovery diode 60 which in turn provides a high amplitude pulse (greater than 15 volts) having an extremely fast rise time (shorter than 100 ps).

Thus, a dual channel TDR has been provided capable of generating flat test pulses having a very sharp rise time with little signal degradation to a device under test which may be sampled at both its input and its output synchronously. This is made possible by the internal connection geometry of the front end of the TDR and by a balanced strobe generator incorporating a wavelength coupler which can control with precision the time at which signals from the device under test are sampled. Since the internal input lines for either channel are located immediately adjacent each other and close to the front panel of the TDR, the effects of signal and wave form degradation and distortion caused by internal reflection or capacitive reactance are minimized.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

I claim:
1. A time domain reflectometer comprising:
   (a) a pair of input channels;
   (b) a pair of sampling gate means, one connected to each of said input channels for sampling signals thereon;
   (c) strobe pulse generator means for providing a trigger pulse; and
   (d) waveguide coupling means responsive to said trigger pulse for generating time coherent sampling pulses for actuating each of said sampling gate means on each of said channels simultaneously.

2. A time domain reflectometer enclosed in a chassis having a front panel, said front panel having input jacks for first and second input channels:
   (a) said first input channel comprising a first internal transmission line connected to one of said input jacks through said front panel and including a first node connected to both a first sampling gate and a first test pulse generator;
   (b) said second input channel comprising a second internal transmission line connected to the other of said input jacks through said front panel and including a second node connected to both a second sampling gate and a second test pulse generator, and
   (c) wherein said first and second nodes are located a uniform short distance along their respective transmission lines adjacent said front panel.

3. The time domain reflectometer of claim 2, further including strobe generator means for generating sampling control pulses, said strobe generator means being connected to each of said first and second nodes by waveguide coupling means for generating sampling pulses to be applied to each of said respective channels at said first and second nodes simultaneously.

4. The time domain reflectometer of claim 3 wherein said waveguide coupling means includes a driving waveguide and a pair of output waveguides inductively coupled to said driving waveguide.

5. The time domain reflectometer of claim 4 wherein said output waveguides are orthogonally disposed with respect to said driving waveguide.

6. The time domain reflectometer of claim 5 wherein said driving waveguide comprises a coplanar waveguide and said output waveguides comprise a pair of slotline waveguides.

7. The time domain reflectometer of claim 2 wherein said internal transmission lines each comprise a signal line and a coaxial ground line separated by air.

8. The time domain reflectometer of claim 7 wherein each of said internal transmission lines includes a cut-away portion wherein said coaxial ground line is cut away from around said signal line to permit each of said signal lines to be connected to respective sampling gates and to test pulse generators at each of said respective first and second nodes.

9. The time domain reflectometer of claim 8 wherein for each channel the sampling gate and the test pulse generator are disposed on opposite sides of said signal line.

10. A time domain reflectometer comprising:
(a) a pair of input channels, each of said input channels including an internal input line;
(b) current pulse generator means for generating test pulses for each of said channels and connected to a node for each respective internal input line;
(c) first and second sampling gate means for sampling signals resulting from said test pulses in each of said channels wherein each sampling gate means is connected to each one of said respective nodes; and
(d) strobe pulse generating means for generating sampling pulses for controlling the actuation of said sampling gate means for each of said input channels such that both sampling gate means sample data on each of said input channels simultaneously.

11. The time domain reflectometer of claim 1 wherein said sampling pulses comprise for each of said sampling gate means, a positive and negative pulse, generated simultaneously.

12. The time domain reflectometer of claim 11 wherein said waveguide coupling means comprises a coplanar waveguide and a pair of slotline waveguides inductively coupled to said coplanar waveguide.

13. The time domain reflectometer of claim 12 wherein each of said slotline waveguides is oriented at a right angle to said coplanar waveguide.

14. The time domain reflectometer of claim 13 wherein both of said slotline waveguides are disposed colinearly with respect to one another on opposite sides of said coplanar waveguide.

15. The time domain reflectometer of claim 10 wherein said waveguide coupling means comprises a ground plane conductor having two slots therein, disposed at right angles to one another, and a signal-carrying conductor disposed within one of said slots to form a coplanar waveguide, the other of said slots having opposite ends thereof connected to said sampling gate means for each of said input channels, respectively.

16. The time domain reflectometer of claim 1 wherein said waveguide coupling means includes step recovery diode driver means responsive to said trigger pulse for generating a relatively high amplitude fast rise time driving pulse.

17. The time domain reflectometer of claim 16 wherein said step recovery diode driver means comprises a step recovery diode coupled to an electronic switch pair wherein one of the electronic switches in said pair is permanently on, and the other of said electronic switches is responsive to said trigger pulse.

18. The time domain reflectometer of claim 17 wherein said step recovery diode and said electronic switch pair are coupled to one another by an inductor.

19. The time domain reflectometer of claim 18 wherein said inductor comprises a bond wire connection.

20. The time domain reflectometer of claim 19 wherein said step recovery diode is connected between said ground plane and said signal-carrying conductor within one of said slots.

21. The time domain reflectometer of claim 10 wherein said balanced strobe pulse generating means includes a driver circuit and a step recovery diode circuit responsive to a trigger pulse for providing high amplitude fast rise time pulses to be coupled to each of said sampling gate means.

* * * * *